US007012117B2

(12) United States Patent
Izumi et al.

(10) Patent No.: US 7,012,117 B2
(45) Date of Patent: Mar. 14, 2006

(54) WATER-DISPERSIBLE RESIN COMPOSITION FOR USE IN BORING HOLE IN PRINTED WIRING BOARD, SHEET COMPRISING THE COMPOSITION, AND METHOD FOR BORING HOLE IN PRINTED WIRING BOARD USING THE SHEET

(75) Inventors: Tsukasa Izumi, Ibaraki (JP); Hiroaki Satoh, Ibaraki (JP)

(73) Assignee: The Nippon Synthetic Chemical Industry Co., Ltd., Osaka (JP)

( * ) Notice: Subject to any disclaimer, the term of this patent is extended or adjusted under 35 U.S.C. 154(b) by 26 days.

(21) Appl. No.: 10/484,375

(22) PCT Filed: Jul. 16, 2002

(86) PCT No.: PCT/JP02/07196

§ 371 (c)(1), (2), (4) Date: Jan. 16, 2004

(87) PCT Pub. No.: WO03/008502

PCT Pub. Date: Jan. 30, 2003

(65) Prior Publication Data

US 2004/0209091 A1 Oct. 21, 2004

(30) Foreign Application Priority Data

Jul. 17, 2001 (JP) ............................ 2001-216186

(51) Int. Cl.
*C08L 101/14* (2006.01)
*C08L 33/06* (2006.01)
*C08L 29/04* (2006.01)

(52) U.S. Cl. ............................ 525/57; 29/825; 525/87

(58) Field of Classification Search .................. 525/57, 525/87

See application file for complete search history.

(56) References Cited

U.S. PATENT DOCUMENTS 6,730,722 B1 * 5/2004 Eck et al. ...................... 524/3

FOREIGN PATENT DOCUMENTS

| | | | |
|---|---|---|---|
| EP | 470757 | A | 2/2002 |
| JP | 4-277697 | A | 10/1992 |
| JP | 5-169400 | A | 7/1993 |
| JP | 8-197496 | A | 8/1996 |

* cited by examiner

*Primary Examiner*—D. S. Nakarani

(57) ABSTRACT

The present invention provides a water-dispersant resin composition for perforating a printed wiring board excellent in preciseness of the processing position and plating throwing power when perforating, a sheet for perforating using the composition, a process for perforating a printed wiring board using the sheet. More specifically, the present invention provides a water-dispersant resin composition for perforating a printed wiring board comprising a water-soluble polymer (A) and a polymer compound (B) containing the compound represented by the following formula (1) as a copolymer component, a sheet for perforating using the composition, and a process for perforating a printed wiring board using the sheet.

(1)

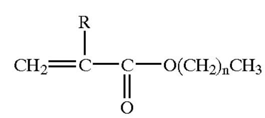

(wherein, R represents hydrogen or a methyl group, and n represents an integer of 10 to 22).

11 Claims, No Drawings

WATER-DISPERSIBLE RESIN COMPOSITION FOR USE IN BORING HOLE IN PRINTED WIRING BOARD, SHEET COMPRISING THE COMPOSITION, AND METHOD FOR BORING HOLE IN PRINTED WIRING BOARD USING THE SHEET

CROSS-REFERENCE TO RELATED APPLICATION

This application is the U.S. National Stage of International Application Number PCT/JP02/07196 filed Jul. 16, 2002 and claiming priority from Japanese Application No. 2001-216186 filed Jul. 17, 2001.

TECHNICAL FIELD

The present invention relates to a water-dispersant resin composition for perforating a printed wiring board, which is useful in perforation for forming a through hole on a laminated plate such as a multi-layer printed wiring board, a sheet comprising the composition and a process for perforating a printed wiring board using the sheet.

BACKGROUND ART

In perforation for forming a through hole on a laminated substrate such as a printed wiring board, in the case that the diameter of the hole is large, perforation is conducted by placing a drill directly on the substrate. However, in the case of a general-purpose substrate with a small-diameter hole, generally thin metal film such as aluminum foil and a layer of various water-soluble compounds are placed on the above substrate and the substrate is perforated using a drill, a gimlet or a puncher.

In the above methods, the film of a water-soluble compound is used to prevent slipping of the drill-bit part caused by unevenness on the surface of the substrate and to precisely place the tip of the drill on the desired location for the through hole part, that is, to secure preciseness of the processing position. Furthermore, the aluminum foil is used to prevent peeling of the copper face on the substrate when pulling out the drill after perforating the substrate, that is prevention of burn, along with problems such as clogging of the through hole part caused by heat generated in the through hole part and adhesion of shaving scraps, which occur when perforating. By using a laminate of the aluminum foil/water-soluble compound film, through hole processing is conducted efficiently. Moreover, the water-soluble compound film has the advantage of being removable from the substrate by washing the substrate with water after perforating.

Described below are known documents describing the water-soluble compound used for the above purpose. For instance, (1) JP-A-4-92488 and (2) JP-A-4-92494 disclose applying polyethylene glycol or polypropylene glycol on one face or both faces of a substrate. (3) JP-A-7-96499 discloses applying a water-soluble polymer comprising a polyalkylene oxide compound and polycarboxylic acid and/or a diisocyanate compound. (4) JP-A-10-6298 discloses applying a composition comprising the water-soluble polymer and a metal compound.

However, the disclosed arts (1) and (2) have problems when perforating the through hole, such as stickiness tends to occur on the surface of the water-soluble compound film and preciseness of the processing position for the through hole part decreases, especially under conditions of high water content such as a high humidity atmosphere. Also, when using the water-soluble compound as a film, the moldability is poor and forming into a sheet becomes difficult.

Also, there is room for improvement in the above disclosed arts (3) and (4), from the viewpoint of preciseness of the processing position when conducting perforation continuously using a fine drill with a drill diameter of 0.15 mm.

Furthermore, each of the disclosed arts (1)~(4) need to be improved further in plating throwing power, that is plating uniformly when plating the interior of the through hole, which is one of the recent high demands regarding quality.

DISCLOSURE OF INVENTION

As a result of intensive research to solve the above problems, a water-dispersant resin composition for perforating a printed wiring board which comprises a water-soluble polymer (A), particularly a polyvinyl alcohol resin, and a polymer compound (B) containing a compound represented by the following formula (1) as a copolymer component, was found to solve the problems and the present invention was achieved.

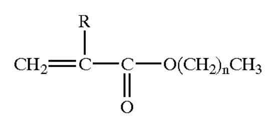

(1)

(wherein, R represents hydrogen or a methyl group, and n represents an integer of 10 to 22).

That is, the present invention relates to a water-dispersant resin composition for perforating a printed wiring board comprising a water-soluble polymer (A) and a polymer compound (B) containing a compound represented by the following formula (1) as a copolymer component

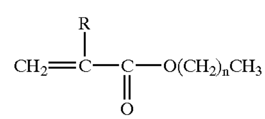

(1)

(wherein, R represents hydrogen or a methyl group, and n represents an integer of 10 to 22).

Preferably, 30 to 90% by weight of water-soluble polymer (A) and 10 to 70% by weight of polymer compound (B) containing a compound represented by said formula (1) as a copolymer component is contained.

The water-soluble polymer (A) is preferably a polyvinyl alcohol resin.

The polyvinyl alcohol resin preferably has a hydrolyzation degree of at least 65% by mole and a viscosity of 2.5 to 100 mPa·s at 20° C. of a 4% by weight aqueous solution.

The present invention also relates to a sheet for perforating a printed wiring board comprising the water-dispersant resin composition for perforating a printed wiring board.

The present invention also relates to a sheet for perforating a printed wiring board comprising a substrate on which the water-dispersant resin composition for perforating a printed wiring board is laminated.

The present invention also relates to a process for perforating a printed wiring board which comprises placing the above sheet on a printed wiring board, and perforating the printed wiring board with a drill.

The present invention also relates to a process for perforating a printed wiring board which comprises placing the above sheet so that the substrate surface thereof contacts with a printed wiring board, and perforating the printed wiring board with a drill.

BEST MODE FOR CARRYING OUT THE INVENTION

The water-dispersant resin composition for perforating the printed wiring board of the present invention is described below.

The water-dispersant resin composition of the present invention is obtained by compounding a water-soluble polymer (A) and a polymer compound (B) containing the compound represented by the above formula (1) as a copolymer component.

Examples of the water-soluble polymer (A) are polyvinyl alcohol resin, polyalkylene glycol, starch, sodium polyacrylate, cellulose derivatives, casein, sodium alginate, pectin, polyacrylamide, polyethyleneimine, polyethylene oxide and polyvinylpyrrolidone. Of these, polyvinyl alcohol resin is preferable in view of preciseness of the processing position when perforating with a drill. The case in which polyvinyl alcohol resin is used is described below.

The polyvinyl alcohol resin can be either polyvinyl alcohol or modified polyvinyl alcohol. The polyvinyl alcohol is prepared by homopolymerizing vinyl acetate, and then hydrolyzing. The modified polyvinyl alcohol is prepared by hydrolyzing a polymer of vinyl acetate and another unsaturated monomer or post-modifying polyvinyl alcohol.

Examples of the other unsaturated monomer described above are olefins such as ethylene, propylene, isobutylene, α-octene, α-dodecene and α-octadecene; unsaturated acids such as acrylic acid, methacrylic acid, crotonic acid, maleic acid, maleic anhydride, itaconic acid, salt thereof or mono- or dialkylester thereof; nitriles such as acrylonitrile and methacrylonitrile; amides such as acrylamide and methacrylamide; olefin sulfonic acid such as ethylene sulfonic acid, allyl sulfonic acid, methallyl sulfonic acid and salt thereof; alkyl vinyl ethers; N-acrylamide methyltrimethyl ammonium chloride; allyl trimethyl ammonium chloride; dimethyl allyl vinyl ketone; N-vinyl pyrrolidone; vinyl chloride; vinylidene chloride; polyoxyalkylene (meth)allylether such as polyoxyethylene (meth)allylether and polyoxypropylene (meth)allylether; polyoxyalkylene (meth)acrylate such as polyoxyethylene (meth)acrylate and polyoxypropylene (meth)acrylate; polyoxyalkylene (meth)acrylamide such as polyoxyethylene (meth)acryamide and polyoxypropylene (meth)acrylamide; polyoxyethylene (1-(meth)acrylamide-1, 1-dimethylpropyl)ester; polyoxyethylene vinyl ether; polyoxypropylene vinyl ether; polyoxyethylene allyl amine; polyoxypropylene allyl amine; polyoxyethylene vinyl amine and polyoxypropylene vinyl amine. Of these, ethylene is preferable from the viewpoint of hydrolyzing with ease.

Examples of the methods for post-modifying are acetoacetic esterizing, acetalization, urethanization, etherfication, grafting, phosphate esterification and oxyalkylenization of polyvinyl alcohol.

Of the above polyvinyl alcohol resin, resin having a hydrolyzation degree of at least 65% by mole, more preferably 70 to 100% by mole, most preferably 75 to 99% by mole, is preferable. A hydrolyzation degree of less than 65% by mole is not preferable from the viewpoint that removal of polyvinyl alcohol resin by washing with water after perforating is difficult.

The viscosity of a 4% by weight aqueous solution is preferably 2.5 to 100 mPa·s at 20° C., more preferably 2.5 to 70 mPa·s, most preferably 2.5 to 60 mPa·s. When the viscosity is less than 2.5 mPa·s, the strength of the water-dispersant resin composition of the present invention when used as a film is poor and the film may break when perforating. On the other hand, when the viscosity is more than 100 mPa·s, properties for forming into a film or sheet tend to decrease. The viscosity is measured according to JIS K 6726.

Described below is the polymer compound (B) of the water-dispersant resin composition of the present invention.

The polymer compound (B) is a copolymer of the compound represented by the following formula (1) and another compound

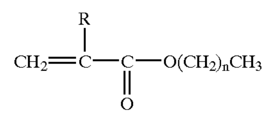

(1)

(wherein, R represents hydrogen or a methyl group, and n represents an integer of 10 to 22).

In the above formula (1), n is 10 to 22, more preferably 15 to 22. A polymer compound obtained by copolymerizing a compound in which n is less than 9 has poor moldability. On the other hand, n which is more than 23 is unpreferable, as compatibility between the polymer compound (B) and the water-soluble polymer (A) decreases.

The examples of the compound represented by formula (1) are stearyl (meth)acrylate, pentadeca (meth)acrylate, palmitil (meth)acrylate and heptadecane (meth)acrylate. Of these, stearyl (meth)acrylate is preferable in view crystallinility at room temperature and flowabillity of liquid at a high temperature.

The other compound to be copolymerized with the compound represented by the above formula (1) is not particularly limited. However, an acrylic compound is preferable from the viewpoint of stability when crystallizing. Examples are (meth)acrylic acid, methyl (meth)acrylate, ethyl (meth) acrylate, propyl (meth)acrylate, butyl (meth)acrylate, hexyl (meth)acrylate, 2-ethylhexyl (meth)acrylate, cyclohexyl (meth)acrylate, benzyl (meth)acrylate, dimethylaminoethyl (meth)acrylate, hydroxyethyl (meth)acrylate, hydoxypropyl (meth)acrylate, and glycidyl (meth)acrylate. Of these, acrylic acid is preferable from the viewpoint of cleaning after perforation.

In the present invention, when preparing the polymer compound (B), the copolymerization ratio of the compound represented by the above formula (1) and the other compound is preferably within a range of 50/50 to 95/5 (weight ratio), more preferably 70/30 to 90/10. When the copolymerization ratio is less than 50/50, plasticity may decrease when the composition of the present invention is left for a long time as a sheet and plating throwing power may decrease when perforation is conducted using the sheet. When the copolymerization ratio is more than 95/5, gel substances tend to separate out from the sheet when storing the sheet for perforating.

Copolymerization is generally conducted by solution polymerization. The reaction solution containing the obtained polymer compound (B) may be used in the water-dispersant resin composition as it is, but is generally used in the water-dispersant resin composition after adjusting the concentration of the resin.

The weight average molecular weight of the polymer compound (B) is preferably 1,000 to 200,000, more preferably 3,000 to 100,000. When the weight average molecular weight is less than 1,000, the compatibility with the water-soluble polymer (A) becomes poor. A weight average molecular weight of more than 200,000 is unpreferable, as the plasticity may decrease when the perforating sheet is formed and left for a long time.

Commercial products of the polymer compound (B) are 25 distributed as a solvent solution such as VANARESIN2203, VANARESIN2205, VANARESIN2206, and VANARESIN2207, which are solvent solutions of a copolymer of stearyl methacrylate/acrylic acid, available from Shin-Nakamura Chemical Co., Ltd.

Regarding the compounding amount of the water-soluble polymer (A) and the polymer compound (B) in the water-dispersant composition of the present invention, the compounding amount of (A) is preferably 30 to 90% by weight, more preferably 30 to 70% by weight. The compounding amount of (B) is preferably 10 to 70% by weight, more preferably 30 to 70% by weight. When the compounding amount of the water-soluble polymer (A) is less than 30% by weight or the compounding amount of the polymer compound (B) is more than 70% by weight, the dispersibility of the water-dispersant resin composition tends to decrease. When the compounding amount of the water-soluble polymer (A) is more than 90% by weight or the compounding amount of the polymer compound (B) is less than 10% by weight, the drill may be damaged when perforating continuously with a drill under high humidity.

In the water-dispersant resin composition of the present invention, a lubricant such as a nonionic surfactant, an antirust agent, a stabilizer such as phosphate esters and a known additive such as metal powder and inorganic powder may be added if necessary.

When the water-dispersant resin composition of the present invention is used as a sheet for perforating a printed wiring board (hereinafter, referred to as sheet for perforating), the water-dispersant resin composition is used as a single film or a single sheet, or a laminated sheet of which the composition is laminated on a substrate. Of these, the laminated sheet is preferable in practical use.

The sheet for perforating of the present invention is prepared, for example, by the following process.

First, a 5 to 20% by weight aqueous solution of the water-soluble polymer (A) is prepared. The polymer compound (B) is insoluble in water, but soluble in a solvent, and therefore the copolymer reaction solution is used as it is, or as a solvent solution of 30 to 70% by weight by suitably adjusting the resin concentration. Then, the aqueous solution of the water-soluble polymer (A) and the solvent solution of the polymer compound (B) are dispersed using an agitator and the dispersant is adjusted so as to be within the range of the above compounding ratio. A solid content hereat is preferably 10 to 40% by weight. When the solid content is less than 10% by weight, film thickness tends to be poor when forming the film and when the solid content is more than 40% by weight, mixing and dispersing tend to be poor.

In order to form a single film or a single sheet using the dispersant solution, for example, common film-forming methods such as flow casting, melt extrusion by a T-die or inflation or calender method may be employed. The thickness of the sheet for perforating is preferably adjusted within the range of 60 to 1,000 $\mu$m.

The moisture content of the sheet for perforating obtained by the process described above is preferably adjusted to 1 to 10% by weight, more preferably 1 to 7% by weight.

When the moisture content is less than 1% by weight, cracking tends to occur when forming the sheet or the film. Moisture content of more than 10% by weight is unpreferable as peeling properties of the film from a molding machine become poor. The sheet may contain a small amount of the solvent used when copolymerizing the polymer compound (B), but preferably the amount of the solvent is as little as possible.

When preparing a laminated sheet, the substrate is not particularly limited. Examples of the substrate are metal foil, polyethylene telephthalate, cellulose triacetate, polyvinyl alcohol, polystyrene, and a plastic film and a plastic sheet comprising plastic such as polypropylene. Of these, metal foil is preferable from the viewpoint of preciseness of the position when perforating and preventing burn of a copper-clad laminate. Examples of the metal foil are metal foils of aluminum, zinc or iron. The thickness of the substrate is preferably 50 to 300 $\mu$m, more preferably 100 to 250 $\mu$m. When the thickness of the substrate is less than 50 $\mu$m, warpage caused by stress of the resin film formed on the substrate tends to increase. When the thickness of the substrate is more than 300 $\mu$m, load of the drill increases and the life span of the drill tends to become short.

The thickness of the water-dispersant resin composition layer in the laminated sheet is preferably adjusted within the range of 10 to 700 $\mu$m. When the thickness of the water-dispersant resin composition layer of the laminated sheet is less than 10 $\mu$m, the lubricating component for the drill tends to decrease. When the thickness of the water-dispersant resin composition layer of the laminated sheet is more than 700 $\mu$m, the amount of resin (resin on the substrate, the resin of the copper-clad laminate) which wraps around the drill tends to increase. The overall thickness of the sheet for perforating is not particularly limited, but is adjusted within the range of 60 to 1,000 $\mu$m.

The laminated sheet is prepared by laminating the water-dispersant resin composition on a substrate such as metal foil, a plastic film and a plastic sheet. More specifically, the laminated sheet may be prepared by dissolving the water-soluble polymer (A) in water, adding the solvent solution of the polymer compound (B) thereto in order to disperse, coating the obtained dispersant on the surface of the substrate and removing the medium at a temperature of 40° to 100° C. to form the water-dispersant resin composition layer or by laminating the film or the sheet prepared from the water-dispersant resin composition alone on the substrate by thermocompression bonding or dry lamination.

The process for perforating the printed wiring board using the sheet for perforating is conducted as follows.

The printed wiring board which is used is generally a unified substrate to which metal foil such as copper and an electric insulator are laminated. Examples are a metal foil-clad laminate such as an epoxy substrate having metal foil on the outer layer, a multilayer laminate having a printed wiring circuit in the inner layer and a metal foil-clad laminate and a metal foil-clad plastic film having a printed wiring circuit in the inner layer.

The sheet for perforating of the present invention is placed on one face or both faces of the substrate. Through the sheet, in a specified location of the printed wiring board, a through hole of a specified size is perforated with a drill or a gimlet.

When the sheet for perforating is a laminated sheet, the substrate surface of the sheet is preferably located so as to be in contact with the surface of the printed wiring board, from the viewpoint of increasing preciseness of the position of perforating.

A plurality of printed wiring boards can be perforated simultaneously by laminating the printed wiring boards. In such a case, the sheet for perforating of the present invention (a single film or single sheet of the water-dispersant resin composition or a laminated sheet of which the composition is laminated on a substrate) is preferably placed on the upper face of the topmost substrate and between each substrate.

The sheet for perforating of the present invention may be subjected to adhesion processing on the sheet surface, in order to prevent side slip of the printed wiring boards when used, or to mold release processing, before being removed by dissolving with water and after perforation, for ease in peeling when separating each laminated printed wiring board.

Further, uneven patterns may be formed on the sheet surface by conducting dull finish etching and embossing to one face or both faces of the sheet in order to improve the preciseness of the processing position. Examples of the uneven patterns are a grid pattern, a silk pattern, a hexagonal pattern and a diamond pattern. When conducting dull finish etching, practically, the surface roughness (measured by a laser microscope) is adjusted to about 1 to 5 $\mu$m and uneven set is at most 200 mesh and a depth of about 1 to 5 $\mu$m (measured according to JIS B 0601).

Hereinafter, the present invention is described in detail by means of Examples, but not limited thereto.

In Examples, "%" and "part" represent the weight standard unless described otherwise.

EXAMPLE 1

11 parts of polyvinyl alcohol resin ("GOHSENOL KM-11" available from The Nippon Synthetic Chemical Industry Co., Ltd.), in which the hydrolyzation degree is 78% by mole and the viscosity of a 4% aqueous solution is 13 mPa·s at 20° C., was dissolved in 59 parts of water. To the aqueous solution, 30 parts (copolymer content 16.5 parts) of a toluene/isopropanol solution (weight ratio 7/3) containing 55% of a copolymer of stearyl methacrylate/acrylic acid (copolymerization ratio 85/15) having a weight average molecular weight of 20,000 ("VANARESIN2206", available from Shin-Nakamura Chemical Co., Ltd.) was mixed while stirring and 100 parts (solid content 27.5 parts) of a dispersant of the water-dispersant resin composition was obtained.

The above dispersant was coated on an aluminum foil with a thickness of 100 $\mu$m using an applicator of 35 mil and a coating with a film thickness of 160 $\mu$m was formed by drying for 96 hours at 65° C. to obtain the sheet for perforating. In the water-dispersant resin composition layer of the sheet, both toluene and isopropanol were not contained and the moisture content of the sheet was 2%.

Next, two printed wiring boards with an overall thickness of 0.4 mm, to which a copper foil with a thickness of 18 $\mu$m is laminated on both faces, were laminated. The sheet for perforating was placed thereon so that the aluminum foil surface contacts the copper surface. Then, 1000 through holes which penetrate the two substrates were formed by a 0.15 mm $\phi$ drill under conditions of room temperature and 30% RH. Regarding the obtained perforated substrate, the preciseness of the processing position and plating throwing power were evaluated as described below.

(Preciseness of the Processing Position)

The actual center of the hole was measured and the difference from the pre-determined position was measured using a digital measuring machine ("DR-555-D" made by Dainippon Screen Mfg. Co., Ltd.). The average value of the first, five hundredth and thousandth hole of the first and second printed wiring boards was calculated and the standard deviation $\sigma$ was found to calculate the value (average value $+3\sigma$). Evaluation was conducted in the following manner.

◎:less than 15% of the drill diameter
○:15% to less than 20% of the drill diameter
Δ:20% to less than 30% of the drill diameter
x:at least 30% of the drill diameter (Plating Throwing Power)

To the perforating substrate, copper plating (plating bath: "COPPERGLEAM125" available from Meltex Inc.) was applied. The cross section of the seven hundred fiftieth and thousandth hole of the first and second substrates were studied and evaluation was conducted in the following manner.

○:Copper plating was applied uniformly on all holes.
Δ:Uniformity of copper plating on one of the holes is poor.
x:Uniformity of copper plating on at least two holes is poor.

EXAMPLE 2

The water-dispersant resin composition and the sheet for perforating were prepared and evaluation was conducted in the same manner as in Example 1, except that polyvinyl alcohol resin, in which the hydrolyzation degree is 75% by mole and the viscosity of a 4% aqueous solution is 7 mPa·s at 20° C., was used instead of the polyvinyl alcohol resin used in Example 1.

EXAMPLE 3

The water-dispersant resin composition and the sheet for perforating were prepared and evaluation was conducted in the same manner as in Example 1, except that polyvinyl alcohol resin in which the hydrolyzation degree is 88% by mole and the viscosity of a 4% aqueous solution is 52 mPa·s at 20° C. was used instead of the polyvinyl alcohol resin used in Example 1.

EXAMPLE 4

The water-dispersant resin composition and the sheet for perforating were prepared and evaluation was conducted in the same manner as in Example 1, except that polyethylene glycol having a weight average molecular weight of 20,000 ("PEG20000" available from Kishida Chemical Co., Ltd.) was used instead of the polyvinyl alcohol resin used in Example 1.

EXAMPLE 5

The water-dispersant resin composition and the sheet for perforating were prepared and evaluation was conducted in the same manner as in Example 1, except that a toluene/isopropanol solution (weight ratio 7/3) containing 55% of a copolymer of stearyl methacrylate/acrylic acid (copolymerization ratio 90/10) having a weight average molecular weight of 17,000 ("VANARESIN2203", available from Shin-Nakamura Chemical Co., Ltd.) was used instead of "VANARESIN2206" available from Shin-Nakamura Chemical Co., Ltd. used in Example 1.

EXAMPLE 6

The water-dispersant resin composition and the sheet for perforating were prepared and evaluation was conducted in the same manner as in Example 1, except that the compounding amount of the polyvinyl alcohol resin in Example 1 was increased to 22 parts and the resin was dissolved in 118 parts of water.

EXAMPLE 7

The dispersant of the water-dispersant resin composition prepared in Example 1 was formed into a film by flow-casting in a rotating heated drum made of steel which was adjusted to 93° C. and then dried until toluene and isopropanol were not contained therein and the moisture content became 4%, to obtain the sheet for perforating with a thickness of 240 μm. The sheet was placed on the same substrate as in Example 1 and evaluation was conducted in the same manner as in Example 1.

EXAMPLE 8

The sheet for perforating were prepared and evaluation was conducted in the same manner as in Example 1, except that a substrate of polyethylene terephthalate film with a thickness of 30 μm was used instead of the substrate of an aluminum foil with a thickness of 100 μm used in Example 1.

COMPARATIVE EXAMPLE 1

The water-dispersant resin composition and the sheet for perforating were prepared and evaluation was conducted in the same manner as in Example 1, except that the aqueous solution of polyvinyl alcohol resin used in Example 1 was not compounded.

The evaluation results of Examples and Comparative Example are shown in Table 1.

TABLE 1

| | Preciseness of Processing Position | Plating Throwing Power |
|---|---|---|
| Ex. 1 | ◎ | ○ |
| Ex. 2 | ◎ | ○ |
| Ex. 3 | ◎ | ○ |
| Ex. 4 | ○ | ○ |
| Ex. 5 | ◎ | ○ |
| Ex. 6 | ◎ | ○ |
| Ex. 7 | ◎ | ○ |
| Ex. 8 | ◎ | ○ |
| Com. Ex. 1 | ◎ | x |

Industrial Applicability

The water-dispersant resin composition for perforating a printed wiring board of the present invention comprises the water-soluble polymer (A) and the polymer compound (B) containing a specific compound as the copolymer component. Therefore, when perforating a printed wiring board using the sheet obtained by molding the composition, preciseness of the processing position and plating throwing power when perforating are excellent.

The invention claimed is:

1. A water-dispersant resin composition for perforating a printed wiring board comprising a water-soluble polymer (A) and a polymer compound (B) containing a compound represented by the following formula (1) as a copolymer component (1)

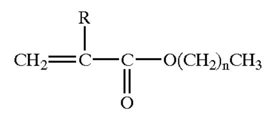

wherein, R represents hydrogen or a methyl group, and n represents an integer of 14 to 22.

2. The water-dispersant resin composition for perforating a printed wiring board of claim 1, comprising 30 to 90% by weight of said water-soluble polymer (A) and 10 to 70% by weight of said polymer compound (B) containing a compound represented by said formula (1) as a copolymer component.

3. The water-dispersant resin composition for perforating a printed wiring board of claim 2, wherein said water-soluble polymer (A) is a polyvinyl alcohol resin.

4. The water-dispersant resin composition for perforating a printed wiring board of claim 10, wherein said polyvinyl alcohol resin has a hydrolyzation degree of at least 65% by mole and a viscosity of 2.5 to 100 mPa·s at 20° C. of a 4% by weight aqueous solution.

5. The water-dispersant resin composition for perforating a printed wiring board of claim 1, wherein said water-soluble polymer (A) is a polyvinyl alcohol resin.

6. The water-dispersant resin composition for perforating a printed wiring board of claim 5, wherein said polyvinyl alcohol resin has a hydrolyzation degree of at least 65% by mole and a viscosity of 2.5 to 100 mPa·s at 20° C. of a 4% by weight aqueous solution.

7. A sheet for perforating a printed wiring board comprising the composition of claim 1.

8. A process for perforating a printed wiring board which comprises placing the sheet of claim 7 on a printed wiring board, and perforating said printed wiring board with a drill.

9. A sheet for perforating a printed wiring board comprising a substrate on which the composition of claim 1 is laminated.

10. A process for perforating a printed wiring board which comprises placing the substrate surface of the sheet of claim 9 so as to contact with a printed wiring board, and perforating said printed wiring board with a drill.

11. A process for perforating a printed wiring board which comprises placing the sheet of claim 9 on a printed wiring board, and perforating said printed wiring board with a drill.

* * * * *